(12) United States Patent
Sleight et al.

(10) Patent No.: US 8,643,107 B2
(45) Date of Patent: Feb. 4, 2014

(54) BODY-TIED ASYMMETRIC N-TYPE FIELD EFFECT TRANSISTOR

(75) Inventors: Jeffrey W. Sleight, Ridgefield, CT (US); Chung-Hsun Lin, White Plains, NY (US); Josephine B. Chang, Mahopac, NY (US); Leland Chang, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 514 days.

(21) Appl. No.: 12/683,634

(22) Filed: Jan. 7, 2010

(65) Prior Publication Data

US 2011/0163380 A1    Jul. 7, 2011

(51) Int. Cl.
  *H01L 27/01*  (2006.01)
  *H01L 27/12*  (2006.01)
  *H01L 31/0392*  (2006.01)

(52) U.S. Cl.
  USPC ........... 257/347; 257/336; 257/344; 438/302; 438/525

(58) Field of Classification Search
  USPC .......... 257/336, 344, 347, E21.137, E21.138; 438/302, 262, 525, 531, 549, 354
  See application file for complete search history.

(56) References Cited

U.S. PATENT DOCUMENTS

| | | | |
|---|---|---|---|
| H986 H | 11/1991 | Codella et al. | 437/41 |
| 5,095,348 A | 3/1992 | Houston | 357/23.7 |
| 5,145,802 A | 9/1992 | Tyson et al. | 437/63 |
| 5,185,280 A * | 2/1993 | Houston et al. | 438/163 |
| 5,317,181 A | 5/1994 | Tyson | 257/347 |
| 5,358,879 A | 10/1994 | Brady et al. | 437/44 |
| H1435 H | 5/1995 | Cherne et al. | 257/347 |
| 5,650,340 A * | 7/1997 | Burr et al. | 438/286 |
| 5,767,549 A | 6/1998 | Chen et al. | 257/347 |
| 5,780,912 A * | 7/1998 | Burr et al. | 257/408 |
| 6,177,708 B1 * | 1/2001 | Kuang et al. | 257/347 |
| 6,198,142 B1 | 3/2001 | Chau et al. | 257/408 |
| 6,201,761 B1 | 3/2001 | Wollesen | 365/233 |
| 6,242,329 B1 * | 6/2001 | Huster et al. | 438/531 |
| 6,255,219 B1 | 7/2001 | Xiang et al. | 438/705 |
| 6,268,630 B1 | 7/2001 | Schwank et al. | 257/347 |
| 6,271,565 B1 | 8/2001 | Hook et al. | 257/344 |
| 6,274,441 B1 | 8/2001 | Mandelman et al. | 438/286 |
| 6,351,158 B1 | 2/2002 | Shearon et al. | 327/108 |
| 6,353,245 B1 | 3/2002 | Unnikrishnan | 257/347 |
| 6,380,572 B1 | 4/2002 | Pain et al. | 257/292 |
| 6,384,457 B2 | 5/2002 | Tyagi et al. | 257/408 |
| 6,420,761 B1 | 7/2002 | Gauthier, Jr. et al. | 257/360 |
| 6,466,489 B1 | 10/2002 | Ieong | 365/189.09 |
| 6,482,724 B1 | 11/2002 | Chatterjee | 438/525 |

(Continued)

OTHER PUBLICATIONS

D. Bearden, "SOI Design Experiences with Motorola's High-Performance Processors", 2002 IEEE International SOI Conference, Oct. 2002, pp. 6-9.

*Primary Examiner* — Phuc Dang
(74) *Attorney, Agent, or Firm* — Harrington & Smith (57) ABSTRACT

In one exemplary embodiment of the invention, an asymmetric N-type field effect transistor includes: a source region coupled to a drain region via a channel; a gate structure overlying at least a portion of the channel; a halo implant disposed at least partially in the channel, where the halo implant is disposed closer to the source region than the drain region; and a body-tie coupled to the channel. In a further exemplary embodiment, the asymmetric N-type field effect transistor is operable to act as a symmetric N-type field effect transistor.

23 Claims, 3 Drawing Sheets

(56) References Cited

U.S. PATENT DOCUMENTS

| | | | |
|---|---|---|---|
| 6,489,223 B1 | 12/2002 | Hook et al. | 438/524 |
| 6,504,218 B1 | 1/2003 | Kadosh et al. | 257/369 |
| 6,596,554 B2 | 7/2003 | Unnikrishnan | 438/18 |
| 6,596,594 B1 | 7/2003 | Guo | 438/279 |
| 6,667,512 B1 | 12/2003 | Huster et al. | 257/328 |
| 6,746,924 B1 | 6/2004 | Lee et al. | 438/286 |
| 6,756,637 B2 | 6/2004 | Adkisson et al. | 257/345 |
| 6,833,307 B1 * | 12/2004 | Wristers et al. | 438/302 |
| 6,949,796 B1 | 9/2005 | Ellis-Monaghan et al. | 257/335 |
| 6,953,738 B2 | 10/2005 | Veeraraghavan et al. | 438/479 |
| 6,982,216 B1 | 1/2006 | Yamashita | 438/525 |
| 7,125,777 B2 | 10/2006 | Cai et al. | 438/286 |
| 7,129,138 B1 | 10/2006 | Furukawa et al. | 438/294 |
| 7,132,683 B1 | 11/2006 | Krishnan et al. | 257/40 |
| 7,138,318 B2 | 11/2006 | Wu et al. | 438/289 |
| 7,157,357 B2 | 1/2007 | Kim | 438/525 |
| 7,208,397 B2 | 4/2007 | Feudel et al. | 438/525 |
| 7,226,843 B2 | 6/2007 | Weber et al. | 438/305 |
| 7,253,062 B2 | 8/2007 | Wang et al. | 438/286 |
| 7,256,458 B2 | 8/2007 | Nowak | 257/347 |
| 7,354,839 B2 | 4/2008 | Wei et al. | 438/305 |
| 7,485,923 B2 | 2/2009 | Takemura et al. | 257/336 |
| 7,595,247 B2 | 9/2009 | Dokumaci et al. | 438/300 |
| 7,679,139 B2 | 3/2010 | Larsen et al. | 257/347 Q |
| 7,820,530 B2 * | 10/2010 | Min et al. | 438/479 |
| 2002/0014664 A1 * | 2/2002 | Mandelman et al. | 257/350 |
| 2002/0048919 A1 * | 4/2002 | Iwamatsu et al. | 438/592 |
| 2002/0050614 A1 | 5/2002 | Unnikrishnan | 257/347 |
| 2002/0149058 A1 * | 10/2002 | Culp et al. | 257/354 |
| 2003/0011009 A1 | 1/2003 | Zhang et al. | 257/284 |
| 2003/0102524 A1 | 6/2003 | Franca-Neto | 257/549 |
| 2003/0211663 A1 * | 11/2003 | Min et al. | 438/148 |
| 2004/0087094 A1 | 5/2004 | Wristers et al. | 438/302 |
| 2004/0241969 A1 | 12/2004 | Wu et al. | 438/525 |
| 2005/0127442 A1 | 6/2005 | Veeraraghavan et al. | 257/347 |
| 2006/0043430 A1 * | 3/2006 | Feudel et al. | 257/213 |
| 2006/0231893 A1 | 10/2006 | Bernstein et al. | 257/347 |
| 2006/0231899 A1 | 10/2006 | Chang et al. | 257/368 |
| 2006/0234428 A1 | 10/2006 | Furukawa et al. | 438/149 |
| 2006/0255465 A1 * | 11/2006 | Kishiro | 257/758 |
| 2006/0258072 A1 | 11/2006 | Kavalieros et al. | 438/197 |
| 2007/0099386 A1 | 5/2007 | Coolbaugh et al. | 438/286 |
| 2007/0257310 A1 | 11/2007 | Roper et al. | 257/347 |
| 2008/0009114 A1 | 1/2008 | Bernstein et al. | 438/256 |
| 2008/0020515 A1 | 1/2008 | White et al. | 438/118 |
| 2008/0185581 A1 | 8/2008 | Chen et al. | 247/48 |
| 2008/0185662 A1 | 8/2008 | Yang | 257/386 |
| 2008/0237708 A1 | 10/2008 | Mandelman et al. | 257/347 |
| 2008/0296676 A1 * | 12/2008 | Cai et al. | 257/335 |
| 2009/0065866 A1 | 3/2009 | Larsen et al. | 257/347 |
| 2009/0101976 A1 | 4/2009 | Madhavan et al. | 257/347 |
| 2010/0090281 A1 | 4/2010 | Meneghesso et al. | 257/348 |

* cited by examiner

BODY-TIED ASYMMETRIC N-TYPE FIELD EFFECT TRANSISTOR

CROSS REFERENCE TO RELATED APPLICATIONS

This application is related to U.S. patent application Ser. No. 12/683,606, filed on Jan. 7, 2010 (the same date as the instant patent application), which is incorporated by reference herein in its entirety.

TECHNICAL FIELD

The exemplary embodiments of this invention relate generally to field effect transistors (FETs) and, more specifically, relate to body-tied FETs.

BACKGROUND

Semiconductors and integrated circuit chips have become ubiquitous within many products due to their continually decreasing cost and size. In the microelectronics industry as well as in other industries involving construction of microscopic structures (e.g., micromachines, magnetoresistive heads, etc.) there is a continued desire to reduce the size of structural features and microelectronic devices and/or to provide a greater amount of circuitry for a given chip size. Miniaturization in general allows for increased performance (more processing per clock cycle and less heat generated) at lower power levels and lower cost. Present technology is at or approaching atomic level scaling of certain micro-devices such as logic gates, FETs and capacitors, for example. Circuit chips with hundreds of millions of such devices are not uncommon. Further size reductions appear to be approaching the physical limit of trace lines and micro-devices that are embedded upon and within their semiconductor substrates. The present invention is directed to such micro-sized devices.

Basically, a FET is a transistor having a source, a gate, and a drain. The action of the FET depends on the flow of majority carriers along a channel between the source and drain that runs past the gate. Current through the channel, which is between the source and drain, is controlled by the transverse electric field under the gate.

As known to those skilled in the art, P-type FETs (PFETs) turn ON to allow current flow from source to drain when the gate terminal is at a low or negative potential with respect to the source. When the gate potential is positive or the same as the source, the P-type FET is OFF, and does not conduct current. On the other hand, N-type FETs (NFETs) turn ON to allow current flow from source to drain when the gate terminal is high or positive with respect to the source. When the gate potential is negative or the same as the source, the N-type FET is OFF, and does not conduct current. Note that in each of these cases there is a threshold voltage (e.g., at the gate terminal) for triggering actuation of the FET.

More than one gate (multi-gate) can be used to more effectively control the channel. The length of the gate determines how fast the FET switches, and can be about the same as the length of the channel (i.e., the distance between the source and drain). Multi-gate FETs are considered to be promising candidates to scale complementary metal-oxide semiconductor (CMOS) FET technology down to the sub-22 nm regime. However, such small dimensions necessitate greater control over performance issues such as short channel effects, punch-through, metal-oxide semiconductor (MOS) leakage current and, of particular relevance herein, the parasitic resistance that is present in a multi-gate FET.

The size of FETs has been successfully reduced through the use of one or more fin-shaped channels. A FET employing such a channel structure may be referred to as a FinFET. Previously, CMOS devices were substantially planar along the surface of the semiconductor substrate, the exception being the FET gate that was disposed over the top of the channel. Fins break from this paradigm by using a vertical channel structure in order to maximize the surface area of the channel that is exposed to the gate. The gate controls the channel more strongly because it extends over more than one side (surface) of the channel. For example, the gate can enclose three surfaces of the three-dimensional channel, rather than being disposed only across the top surface of the traditional planar channel.

One technique for affecting the threshold voltage (e.g., increasing the threshold voltage, encouraging a more constant threshold voltage over different gate lengths) is to use locally implanted dopants under the gate edge(s). This is referred to as a "halo" implant. As non-limiting examples, the halo implant may include boron and/or indium.

Silicon-on-insulator (SOI) wafers have been used to exploit the improved quality of monocrystalline silicon provided thereby in an active layer formed on an insulator over a bulk silicon "handling" substrate. Similar attributes can be developed in similar structures of other semiconductor materials and alloys thereof. The improved quality of the semiconductor material of the active layer allows transistors and other devices to be scaled to extremely small sizes with good uniformity of electrical properties.

Unfortunately, the existence of the insulator layer which supports the development of the improved quality of semiconductor material also presents a problem known in the art as floating body effect in transistor structures. The floating body effect is specific to transistors formed on substrates having an insulator layer. The neutral floating body is electrically isolated by source/drain and halo extension regions that form oppositely poled diode junctions at the ends of the transistor conduction channel and floating body while the gate electrode is insulated from the conduction channel through a dielectric. The insulator layer in the substrate completes insulation of the conduction channel and thus prevents discharge of any charge that may develop in the floating body. Charge injection into the neutral body when the transistor is not conducting develops voltages in the conduction channel in accordance with the source and drain diode characteristics.

The voltage developed due to charge collection in the channel has the effect of altering the switching threshold of the transistor. This effect, in turn, alters the signal timing and signal propagation speed since any transistor will have a finite slew rate and the rise and fall time of signals is not instantaneous even when gate capacitance is very small. Therefore, the diode characteristics of the source and drain can be tailored to limit charge build-up in the floating body.

To do so, the diode junctions can be made somewhat leaky to allow the floating body of the transistor to be discharged to an acceptable degree. Unfortunately, since FETs are often formed symmetrically with similar or identical source and drain impurity structures, development of such a characteristic reduces the ratio of resistance of the "ON" and "OFF" states of the transistor, often referred to as the on/off ratio. A large on/off ratio is generally desirable to support maximum circuit fanout (the number of transistor gates a transistor can drive with acceptable switching speed) and to provide maximum signal voltage swing close to the power supply voltage. Therefore, there is a trade-off between limitation of floating body effects and maintaining a suitable on/off ratio.

One approach to reduction of floating body effects is to use body contacts to form a connection from the floating body/conduction channel to the source electrode through the impurity well. In some cases, the body contact effectively ties the body of the FET to ground. This approach is only a partial solution since the well can be highly resistive and the connection can be ineffective. Further, the connection requires additional chip space and, therefore, may affect or preclude achievement of the potential integration density that would otherwise be possible. This type of device may be referred to as a "body-tied" FET, and may be P-type or N-type.

While many designs for FETs are symmetrical, the use of asymmetric devices (e.g., asymmetric or asymmetrical FETs or MOSFETs) has become prevalent, for example, in SOI CMOS technologies. In such asymmetric devices there is a preferred direction for majority charge carrier flow. As an example, this preference may be due to different dopings of or in relation to (i.e., relative to) the source and drain regions, such as different implant dosages or asymmetric implant(s) (e.g., asymmetric source and/or drain extension implants, asymmetric halo implants) relative to the gate channel conductor. Asymmetric devices can provide advantages of increased drive currents and reduced parities. As a non-limiting example, asymmetric extension and halo devices can be fabricated by using angled implants and by using the (possibly dummy) gate to mask the source or drain region (e.g., due to shadowing by the gate structure).

However, a problem arises in scaling these asymmetric devices to groundrules associated with 45 nm technologies and beyond. In that these devices typically offer a significant performance increase (e.g., about 7-15%) from both floating body control and Miller capacitance reduction, the potential loss of this performance for future CMOS technology presents a significant impediment to future development.

BRIEF SUMMARY

In one exemplary embodiment of the invention, an asymmetric N-type field effect transistor comprising: a source region coupled to a drain region via a channel; a gate structure overlying at least a portion of the channel; a halo implant disposed at least partially in the channel, where the halo implant is disposed closer to the source region than the drain region; and a body-tie coupled to the channel.

In another exemplary embodiment of the invention, a semiconductor device comprising a plurality of asymmetric N-type field effect transistors, where each one of the plurality of asymmetric N-type field effect transistors comprises a source region coupled to a drain region via a channel, a gate structure overlying at least a portion of the channel, a halo implant disposed at least partially in the channel, and a body-tie coupled to the channel, where the halo implant is disposed closer to the source region than the drain region.

In a further exemplary embodiment of the invention, an asymmetric N-type field effect transistor comprising a source region, a drain region, a P-type channel, a halo implant disposed at least partially in the channel, a gate structure and a body-tie, where the halo implant is disposed closer to the source region than the drain region and the asymmetric N-type field effect transistor is operable to act as a symmetric N-type field effect transistor due to the body-tie and asymmetric halo implant.

In another exemplary embodiment of the invention, a method for forming an asymmetric N-type field effect transistor comprising: forming a source region and a drain region coupled thereto via a channel; forming a gate structure overlying at least a portion of the channel; performing an angled implant to form a halo implant disposed at least partially in the channel, where the halo implant is disposed closer to the source region than the drain region; and forming a body-tie coupled to the channel.

BRIEF DESCRIPTION OF THE SEVERAL VIEWS OF THE DRAWINGS

The foregoing and other aspects of embodiments of this invention are made more evident in the following Detailed Description, when read in conjunction with the attached Drawing Figures, wherein.

DETAILED DESCRIPTION

The exemplary embodiments of the invention address the density problem by utilizing a body-tied asymmetric (SOI) NFET. It has been determined that a body-tied asymmetric device no longer performs asymmetrically and, instead, acts as a normal symmetric device. Although the body tie would consume some area, the layout could be packed, for example, by alternating the stack orientation. In dense circuits, for example, the body-tied asymmetric NFET device may be used to create a symmetric device in cases where the groundrule spacing would not otherwise allow for a normal symmetric device (e.g., in the same silicon island).

In some exemplary embodiments, the source is overlapped more and the drain less (i.e., the drain is underlapped). As a non-limiting example, this may be accomplished by using an angled extension implant (e.g., using the gate structure to at least partially mask the drain). The drain underlap will drop the effective device Miller capacitance without a substantial resistance penalty, as would occur if the source side was underlapped. Depending on the implant optimization, the overlapped source could drop the total device resistance. In some exemplary embodiments, the angled implant is performed at an angle of 1-89° (relative to a vertical axis, relative to an axis normal to an overall, general surface of the semiconductor device), preferably an angle of about (e.g., approximately, substantially) 10-30°, and even more preferably an angle of about (e.g., approximately, substantially) 20°. In further exemplary embodiments, the implant comprises a zero-degree implant and an angled adder (implant).

For the exemplary embodiments of the invention, any suitable body-tie structure may be utilized. As non-limiting examples, the body-tie may have at least one of the following structures: H-gate, T-gate, Schottky and/or body-source tie. Similarly, any suitable asymmetric implant or doping may be used, such as a halo implant comprising boron and/or indium, as non-limiting examples.

Figure 1:
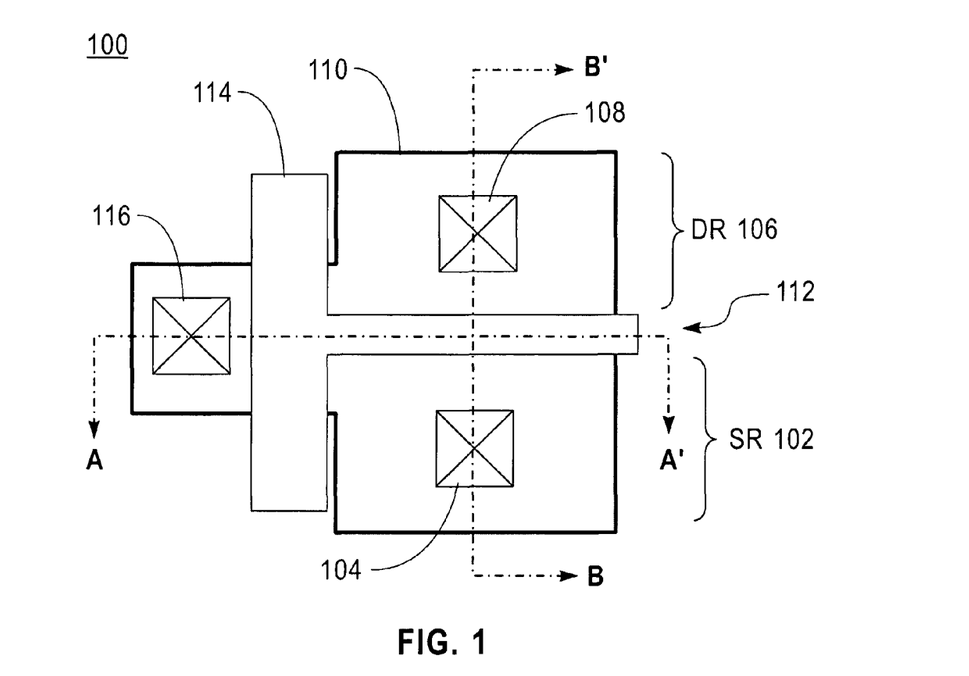
FIG. 1 shows a top plan view of an exemplary body-tied asymmetric N-type FET in accordance with the exemplary embodiments of the invention.

FIG. 1 shows a top plan view of an exemplary body-tied asymmetric N-type FET 100 in accordance with the exemplary embodiments of the invention. The FET 100 has a source region (SR) 102 with a source contact 104 and a drain region (DR) 106 with a drain contact 108 located within an active region 110 of the FET 100. The SR 102 and DR 106 are coupled to one another via a channel 112. Since this is a N-type FET, the channel 112 is a P-type channel. A gate structure (gate) 114 overlies at least a portion of the channel 112. As with a conventional FET, current through the channel 112 is controlled by the transverse electric field under the gate 114. The FET 100 also includes a body contact 116 for the body-tie. The body contact 116 is coupled to the channel 112. A halo implant (see Halo 124 in FIG. 3) is disposed in the channel 112 closer to the SR 102 than the DR 106. This asymmetrical doping may be accomplished via an angled implant (e.g., an angled halo implant) that uses the gate 114 to at least partially mask the DR 106. The body-tie (e.g., via the body contact 116) may be used to apply any desired bias in order to control the body potential (e.g., the accumulation and/or discharge of charge built up in the channel/floating body). As a non-limiting example, the body-tie may be connected to ground. The FET 100 optionally may include source and/or drain extension implants. These will be described in further detail below in reference to FIG. 3.

Figure 2:
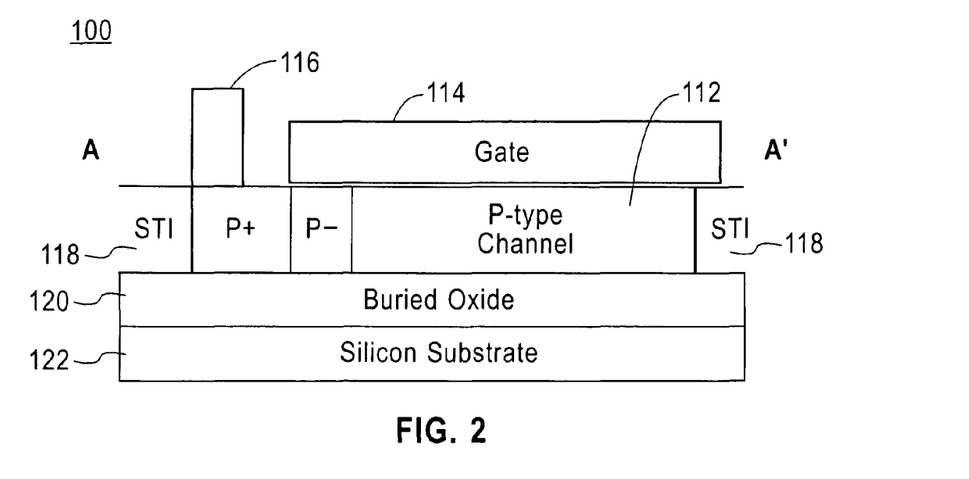
FIG. 2 shows a cross-sectional view across line A-A' of the exemplary body-tied asymmetric N-type FET shown in FIG. 1.

FIG. 2 shows a cross-sectional view across line A-A' of the exemplary body-tied asymmetric N-type FET 100 shown in FIG. 1. The FET 100 also includes a shallow trench isolation (STI) 118. Furthermore, the FET 100 overlies (e.g., is disposed on) a buried oxide layer 120. The buried oxide layer 120 overlies a substrate 122 (e.g., a silicon substrate).

Figure 3:
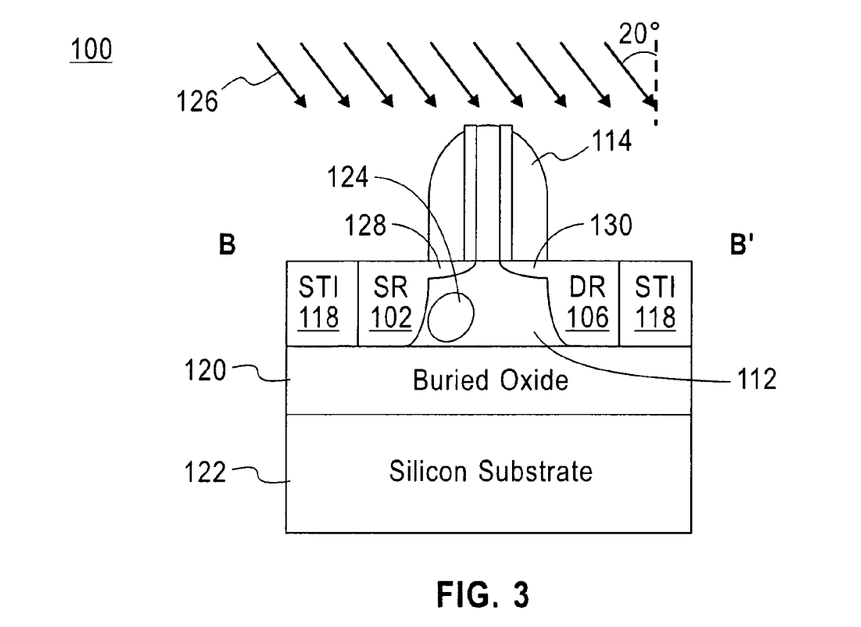
FIG. 3 shows a cross-sectional view across line B-B' of the exemplary body-tied asymmetric N-type FET shown in FIG. 1.

FIG. 3 shows a cross-sectional view across line B-B' of the exemplary body-tied asymmetric N-type FET 100 shown in FIG. 1. In this view, the halo implant (halo) 124 is clearly visible. The halo 124 may be located (e.g., disposed) at least partially within the channel 112. As a non-limiting example, the halo 124 may be formed using an angled halo implant 126. As a further non-limiting example, the angled halo implant 126 may be at an angle of 1-89° (relative to a vertical axis, relative to an axis normal to an overall, general surface of the FET 100), preferably an angle of about (e.g., approximately, substantially) 10-30°, and even more preferably an angle of about (e.g., approximately, substantially) 20°. As can be seen in FIG. 3, the angled halo implant 126 may utilize the gate 114 in order to at least partially mask the DR 106 from the angled halo implant 126. This results in the FET 100 being asymmetric since the halo 124 is disposed closer to the SR 102 than the DR 106.

As shown in FIG. 3, the FET 100 optionally may include source and/or drain extension implants (SE 128 and DE 130, respectively). These extension implants may be formed using an angled implant (e.g., at an angle of 1-89° (relative to a vertical axis, relative to an axis normal to an overall, general surface of the FET 100)). As a non-limiting example, such an angled implant may utilize the gate 114 in order to at least partially mask the DR 106 from the angled implant (e.g., 126). Note that the SE 128 and DE 130 shown in FIG. 3 are symmetric (e.g., in size and/or doping). Further note that the halo 124 is disposed entirely within the channel 112. When the source/drain extension implants are symmetric (e.g., SE 128 and DE 130), they may be formed using a vertical implant as opposed to an angled implant.

Figure 4:
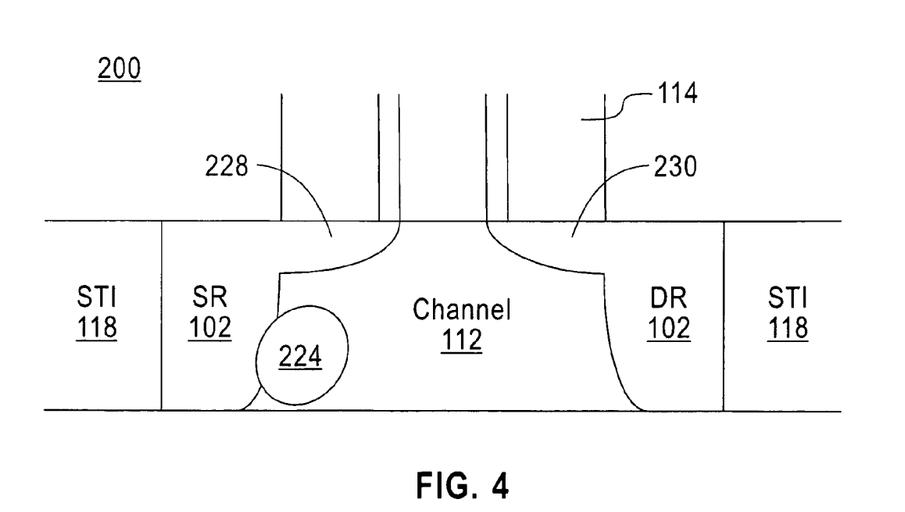
FIG. 4 depicts another exemplary embodiment of a an exemplary body-tied asymmetric N-type FET having asymmetric extension implants and a different disposition of the halo implant.

FIG. 4 depicts another exemplary body-tied asymmetric N-type FET 200 in accordance with the exemplary embodiments of the invention. The FET 200 has asymmetric extension implants and a different disposition of the halo implant. In the FET 200, the source extension implant (SE) 228 is larger than the drain extension implant (DE) 130. The SE 228 may be said to overlap the gate 114 while the DE 130 underlaps the gate 114. Furthermore, the halo implant (halo) 224 is partially disposed in the SR 102. Generally, and as a non-limiting example, it is likely and/or preferable that most exemplary embodiments will resemble the FET 200 shown in FIG. 4 as opposed to the FET 100 of FIG. 3.

Other exemplary embodiments of the invention may include asymmetric source/drain extension implants with the halo implant entirely disposed within the channel. Similarly, still further exemplary embodiments of the invention may include symmetric source/drain extension implants with the halo implant partially disposed within the source region. Any suitable combination of features and locations and arrangements thereof may be utilized in conjunction with the exemplary embodiments of the invention.

As non-limiting examples, the halo implant may comprise (e.g., be doped with) one or more of B, $BF_2$ and In. As non-limiting examples, the source/drain regions may comprise (e.g., be doped with) one or more of As and P. As non-limiting examples, the source/drain extension implants may comprise (e.g., be doped with) one or more of As and P.

One feature of the exemplary body-tied asymmetric N-type FET 100 described above in relation to FIGS. 1-4 is that although the FET 100 is asymmetric (due to the doping), the FET 100 acts as a symmetric FET. This is due to the body-tie and asymmetrical doping (i.e., the halo implant 124). The symmetric operation of the asymmetric FET 100 provides a number of advantages. For example, the asymmetric FET 100 may be used to create a symmetric device in cases where the groundrule spacing would not otherwise allow for a normal symmetric device (e.g., in the same silicon island). Furthermore, and as another example, a semiconductor device may include a plurality of asymmetric FETs 100 without the necessity for also including symmetric FETs. Thus, the patterning and formation of the semiconductor device can be simplified (e.g., fewer masks, fewer operations), for example, because there is no longer a need to mask the symmetric FETs while operations are performed on the asymmetric FETs (and vice versa). This can lead to cost savings and increased efficiency (e.g., at least with respect to production and production costs).

Below are further descriptions of various non-limiting, exemplary embodiments of the invention. The below-described exemplary embodiments are numbered separately for clarity purposes. This numbering should not be construed as entirely separating the various exemplary embodiments since aspects of one or more exemplary embodiments may be practiced in conjunction with one or more other aspects or exemplary embodiments.

(1) In one exemplary embodiment, an asymmetric N-type field effect transistor (FET) comprising: a source region coupled to a drain region via a channel; a gate structure overlying at least a portion of the channel; a halo implant disposed at least partially in the channel, where the halo implant is disposed closer to the source region than the drain region; and a body-tie coupled to the channel.

A FET as above, where the asymmetric N-type field effect transistor is operable to act as a symmetric N-type field effect transistor. A FET as in any above, where the halo implant is partially disposed in the source region. A FET as in any above, further comprising an insulator layer underlying at least the source region, the drain region and the channel. A FET as in any above, further comprising a substrate underlying at least the insulator layer. A FET as in any above, where the insulator layer comprises a buried oxide layer. A FET as in any above, where the substrate comprises silicon.

A FET as in any above, where the halo implant is formed (in the asymmetric N-type field effect transistor) by an angled implant procedure. A FET as in any above, where the angled implant procedure uses the gate structure to mask at least a portion of the drain region. A FET as in any above, where the angled implant procedure comprises performing an angled implant at an angle of substantially (approximately) 20 degrees from a vertical axis (an axis that is normal to a horizontal surface of the asymmetric N-type field effect transistor).

A FET as in any above, where the channel comprises a P-type channel. A FET as in any above, where the body-tie comprises at least one of: an H-gate, a T-gate, a Schottky structure and a body-source tie. A FET as in any above, where the halo implant comprises at least one of boron and indium. A FET as in any above, where the asymmetric N-type field effect transistor comprises an asymmetric silicon-on-insulator N-type field effect transistor.

A FET as in any above, further comprising a source extension implant (e.g., that extends from the source region into the channel). A FET as in any above, further comprising a drain extension implant (e.g., that extends from the drain region into the channel). A FET as in any above, where the source extension implant and drain extension implant are symmetric (e.g., have a similar size and/or a similar doping). A FET as in any above, where the source extension implant and drain extension implant are asymmetric (e.g., have different sizes and/or different doping). A FET as in any above, where the source extension implant overlaps the gate structure and the drain extension implant underlaps the gate structure. A FET as in any above, where at least one of the source extension implant and the drain extension implant is doped with at least one of As and P. A FET as in any above, where at least one of the source region and the drain region is doped with at least one of As and P. A FET as in any above, where the halo implant is doped with at least one of B and $BF_2$.

A FET as in any above, further comprising one or more aspects of the exemplary embodiments of the invention as described in further detail herein.

(2) In another exemplary embodiment, a semiconductor device comprising a plurality of asymmetric N-type field effect transistors, where each one of the plurality of asymmetric N-type field effect transistors comprises a source region coupled to a drain region via a channel, a gate structure overlying at least a portion of the channel, a halo implant disposed at least partially in the channel, and a body-tie coupled to the channel, where the halo implant is disposed closer to the source region than the drain region.

A semiconductor device as above, where the semiconductor device does not comprise a symmetric field effect transistor. A semiconductor device as in any above, where at least one of the plurality of asymmetric N-type field effect transistors is operable to act as a symmetric N-type field effect transistor. A semiconductor device as in any above, further comprising one or more aspects of the exemplary embodiments of the invention as described in further detail herein.

(3) In a further exemplary embodiment, an asymmetric N-type field effect transistor (FET) comprising a source region, a drain region, a P-type channel, a halo implant disposed at least partially in the channel, a gate structure and a body-tie, where the halo implant is disposed closer to the source region than the drain region, where the asymmetric N-type field effect transistor is operable to act as a symmetric N-type field effect transistor due to the body-tie and asymmetric halo implant.

A FET as in any above, further comprising one or more aspects of the exemplary embodiments of the invention as described in further detail herein.

Figure 5:
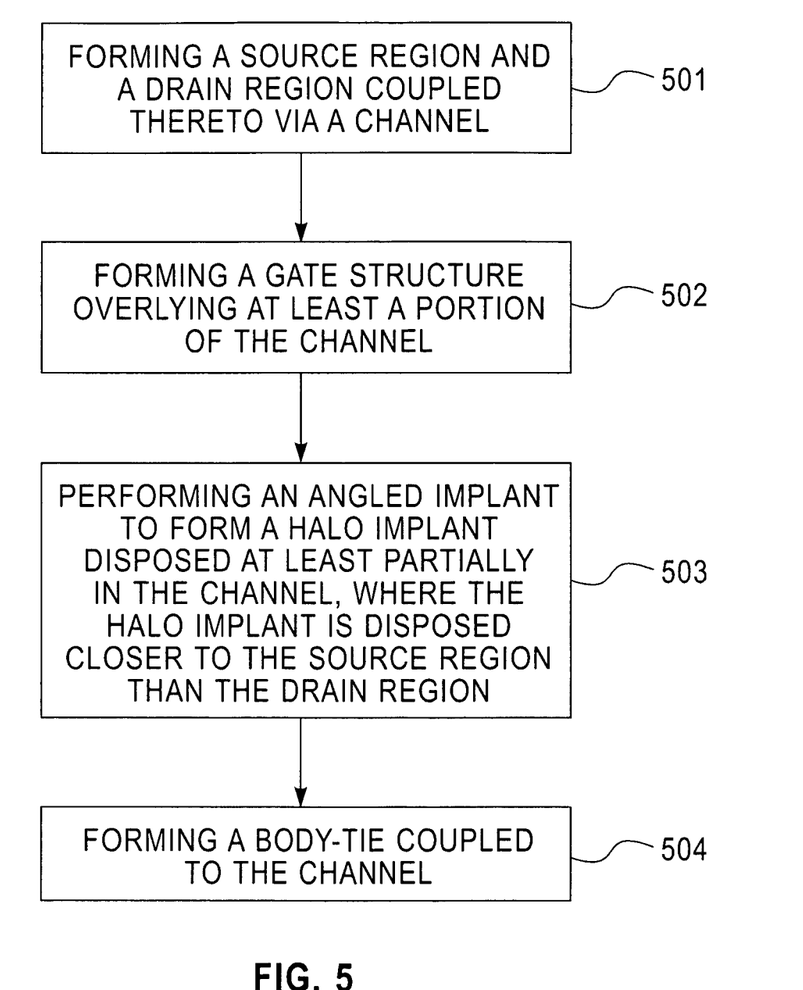
FIG. 5 depicts a flowchart illustrating one non-limiting example of a method for practicing the exemplary embodiments of this invention.

(4) In another exemplary embodiment, and as depicted in FIG. 5, a method for forming an asymmetric N-type field effect transistor comprising: forming a source region and a drain region coupled thereto via a channel (501); forming a gate structure overlying at least a portion of the channel (502); performing an angled implant to form a halo implant disposed at least partially in the channel, where the halo implant is disposed closer to the source region than the drain region (503); and forming a body-tie coupled to the channel (504).

A method as above, where the source region, drain region and channel overly a buried oxide layer, where the buried oxide layer overlies a silicon substrate. A method as in any above, further comprising one or more aspects of the exemplary embodiments of the invention as described in further detail herein. A method as in any above, further comprising: performing at least one other angled implant to form at least one of a source extension implant and a drain extension implant. A method as in any above, further comprising: performing a vertical implant to dope at least one of the source region and the drain region. A method as in any above, where the angled implant uses at least a portion of the gate structure to at least partially mask the drain region.

The blocks shown in FIG. 5 further may be considered to correspond to one or more functions and/or operations that are performed by one or more components, circuits, chips, apparatus, processors, computer programs and/or function blocks. Any and/or all of the above may be implemented in any practicable solution or arrangement that enables operation in accordance with the exemplary embodiments of the invention as described herein.

In addition, the arrangement of the blocks depicted in FIG. 5 should be considered merely exemplary and non-limiting. It should be appreciated that the blocks shown in FIG. 5 may correspond to one or more functions and/or operations that may be performed in any order (e.g., any suitable, practicable and/or feasible order) and/or concurrently (e.g., as suitable, practicable and/or feasible) so as to implement one or more of the exemplary embodiments of the invention. In addition, one or more additional functions, operations and/or steps may be utilized in conjunction with those shown in FIG. 5 so as to implement one or more further exemplary embodiments of the invention.

That is, the exemplary embodiments of the invention shown in FIG. 5 may be utilized, implemented or practiced in conjunction with one or more further aspects in any combination (e.g., any combination that is suitable, practicable and/or feasible) and are not limited only to the steps, blocks, operations and/or functions shown in FIG. 5.

One of ordinary skill in the art will appreciate the various methods and techniques for forming the components identified herein. As non-limiting examples, such formation may involve the deposition and/or etching of various materials and layers. As a further non-limiting example, such formation may utilize photolithographic materials and/or techniques, such as one or more masks (e.g., hard masks, soft masks), photosensitive materials (e.g., photoresist), antireflective coatings and planarization layers. Depositing the materials may include any now known or later developed techniques appropriate for the material to be deposited, including, but not limited to: chemical vapor deposition (CVD), low-pressure CVD (LPCVD), plasma-enhanced CVD (PECVD), semi-atmosphere CVD (SACVD), high density plasma CVD (HD-PCVD), rapid thermal CVD (RTCVD), ultra-high vacuum CVD (UHVCVD), limited reaction processing CVD (LR- PCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating or evaporation.

One of ordinary skill in the art further will appreciate that sharp delineations between areas, regions, zones, elements, parts and/or components of the above-described exemplary semiconductors are often not present. The demarcated regions and elements depicted in the figures (e.g., FIGS. 1-4) are shown for purposes of illustration, and not in limitation of the exemplary embodiments of the invention.

Any use of the terms "connected," "coupled" or variants thereof should be interpreted to indicate any such connection or coupling, direct or indirect, between the identified elements. As a non-limiting example, one or more intermediate elements may be present between the "coupled" elements. The connection or coupling between the identified elements may be, as non-limiting examples, physical, electrical, magnetic, logical or any suitable combination thereof in accordance with the described exemplary embodiments. As non-limiting examples, the connection or coupling may comprise one or more printed electrical connections, wires, cables, mediums or any suitable combination thereof.

Generally, various exemplary embodiments of the invention can be implemented in different mediums, such as software, hardware, logic, special purpose circuits or any combination thereof. As a non-limiting example, some aspects may be implemented in software which may be run on a computing device, while other aspects may be implemented in hardware.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. One of ordinary skill in the art further will appreciate that the various materials, layers, components and arrangements thereof are merely exemplary, and that other or different materials, layers, components and arrangements may be utilized without deviating from the teachings of the exemplary embodiments of the invention. However, all such and similar modifications will still fall within the scope of the teachings of the exemplary embodiments of the invention.

Furthermore, some of the features of the preferred embodiments of this invention could be used to advantage without the corresponding use of other features. As such, the foregoing description should be considered as merely illustrative of the principles of the invention, and not in limitation thereof.

What is claimed is:

1. An asymmetric N-type field effect transistor comprising:
   a drain region;
   a channel;
   a source region coupled to the drain region via the channel;
   a gate structure overlying at least a portion of the channel;
   a halo implant disposed at least partially in the channel, where asymmetry in the asymmetric N-type field effect transistor is at least partially due to the halo implant being disposed closer to the source region than the drain region; and
   a body-tie coupled to the channel, where the body-tie enables application of a bias to control body potential, where the asymmetric N-type field effect transistor operates as a symmetric N-type field effect transistor due to the body-tie and the halo implant.

2. The asymmetric N-type field effect transistor as in claim 1, where the halo implant is partially disposed in the source region.

3. The asymmetric N-type field effect transistor as in claim 1, where the halo implant is formed by an angled implant procedure.

4. The asymmetric N-type field effect transistor as in claim 3, where the angled implant procedure uses the gate structure to mask at least a portion of the drain region.

5. The asymmetric N-type field effect transistor as in claim 1, where the body-tie comprises at least one of: an H-gate, a T-gate, a Schottky structure and a body-source tie.

6. The asymmetric N-type field effect transistor as in claim 1, where the asymmetric N-type field effect transistor comprises an asymmetric silicon-on-insulator N-type field effect transistor.

7. The asymmetric N-type field effect transistor as in claim 1, further comprising: a source extension implant and a drain extension implant, where the source extension implant is coupled to the source region and the drain extension implant is coupled to the drain region, where the source extension implant and the drain extension implant are asymmetrically disposed with the source extension implant being larger than the drain extension implant.

8. A semiconductor device comprising a plurality of asymmetric N-type field effect transistors, where each one of the plurality of asymmetric N-type field effect transistors comprises a drain region, a channel, a source region coupled to the drain region via the channel, a gate structure overlying at least a portion of the channel, a halo implant disposed at least partially in the channel, and a body-tie coupled to the channel, where the body-tie enables application of a bias to control body potential, where asymmetry in the asymmetric N-type field effect transistor is at least partially due to the halo implant being disposed closer to the source region than the drain region, where the asymmetric N-type field effect transistor operates as a symmetric N-type field effect transistor due to the body-tie and the halo implant.

9. The semiconductor device as in claim 8, where the semiconductor device does not comprise a symmetric field effect transistor.

10. The semiconductor device as in claim 8, where the halo implant is formed by an angled implant procedure that uses the gate structure to mask at least a portion of the drain region.

11. The semiconductor device as in claim 8, where the body-tie comprises at least one of: an H-gate, a T-gate, a Schottky structure and a body-source tie.

12. The semiconductor device as in claim 8, where the plurality of asymmetric N-type field effect transistors comprises a plurality of asymmetric silicon-on-insulator N-type field effect transistors.

13. The semiconductor device as in claim 8, where each one of the plurality of asymmetric N-type field effect transistors further comprises a source extension implant and a drain extension implant, where the source extension implant is coupled to the source region and the drain extension implant is coupled to the drain region, where the source extension implant and the drain extension implant are asymmetrically disposed with the source extension implant being larger than the drain extension implant.

14. An asymmetric N-type field effect transistor comprising a source region, a drain region, a P-type channel, a halo implant disposed at least partially in the P-type channel, a source extension implant, a drain extension implant, a gate structure and a body-tie, where the body-tie enables application of a bias to control body potential, where asymmetry in the asymmetric N-type field effect transistor is at least partially due to the halo implant being disposed closer to the source region than the drain region, where the asymmetric N-type field effect transistor operates as a symmetric N-type field effect transistor due to the body-tie and the halo implant, where the source extension implant is coupled to the source region and the drain extension implant is coupled to the drain region, where the source extension implant and the drain extension implant are asymmetrically disposed with the source extension implant being larger than the drain extension implant.

15. The asymmetric N-type field effect transistor as in claim 14, where the halo implant is partially disposed in the source region.

16. The asymmetric N-type field effect transistor as in claim 14, where the body-tie comprises at least one of: an H-gate, a T-gate, a Schottky structure and a body-source tie.

17. The asymmetric N-type field effect transistor as in claim 14, where the asymmetric N-type field effect transistor comprises an asymmetric silicon-on-insulator N-type field effect transistor.

18. A semiconductor structure comprising a first asymmetric field effect transistor and a second asymmetric field effect transistor, where the first asymmetric field effect transistor and the second asymmetric field effect transistor are located within a same silicon island of the semiconductor structure,
where the first asymmetric field effect transistor comprises a drain region, a channel, a source region coupled to the drain region via the channel, a gate structure overlying at least a portion of the channel, a halo implant disposed at least partially in the channel, and a body-tie coupled to the channel,
where the first asymmetric field effect transistor is an asymmetric N-type field effect transistor, where asymmetry in the first asymmetric field effect transistor is at least partially due to the halo implant being disposed closer to the source region than the drain region, where the body-tie enables application of a bias to control body potential, where the first asymmetric field effect transistor operates as a symmetric N-type field effect transistor due to the body-tie and the halo implant, where the second asymmetric field effect transistor operates as an asymmetric field effect transistor.

19. The semiconductor structure as in claim 18, where the same silicon island does not comprise a symmetric field effect transistor.

20. The semiconductor structure as in claim 18, where the halo implant of the first asymmetric field effect transistor is partially disposed in the source region.

21. The semiconductor structure as in claim 18, where the body-tie of the first asymmetric field effect transistor comprises at least one of: an H-gate, a T-gate, a Schottky structure and a body-source tie.

22. The semiconductor structure as in claim 18, where the first asymmetric field effect transistor comprises an asymmetric silicon-on-insulator N-type field effect transistor.

23. The semiconductor structure as in claim 18, where the first asymmetric field effect transistor further comprises a source extension implant and a drain extension implant, where the source extension implant is coupled to the source region and the drain extension implant is coupled to the drain region, where the source extension implant and the drain extension implant are asymmetrically disposed with the source extension implant being larger than the drain extension implant.

* * * * *